(12) United States Patent
Ye et al.

(10) Patent No.: US 9,196,773 B2
(45) Date of Patent: Nov. 24, 2015

(54) HIGH-PERFORMANCE INSULATING HYBRID PHOTOVOLTAIC-THERMAL SOLAR PANEL CORE AND MANUFACTURING METHOD THEREOF

(71) Applicants: ZHUHAI XINGYE NEW ENERGY SCIENCE AND TECHNOLOGY CO., LTD, Zhuhai, Guangdong (CN); ZHUHAI XINGYE GREEN BUILDING SCIENCE AND TECHNOLOGY CO., LTD, Zhuhai, Guangdong (CN); HUNAN XINGYE SOLAR ENERGY SCIENCE AND TECHNOLOGY CO., LTD, Zhuhai, Guangdong (CN); ZHUHAI XINGYE OPTOELECTRONIC SCIENCE AND TECHNOLOGY CO., LTD, Zhuhai, Guangdong (CN)

(72) Inventors: Tingqiao Ye, Zhuhai (CN); Junyi Tan, Zhuhai (CN); Chaofei Zhou, Zhuhai (CN)

(73) Assignees: ZHUHAI XINGYE NEW ENERGY SCIENCE AND TECHNOLOGY CO., LTD, Zhuhai (CN); ZHUHAI XINGYE GREEN BUILDING SCIENCE AND TECHNOLOGY CO., LTD, Zhuhai (CN); HUNAN XINGYE SOLAR ENERGY SCIENCE AND TECHNOLOGY CO., LTD, Zhuhai (CN); ZHUHAI XINGYE OPTOELECTRONIC SCIENCE AND TECHNOLOGY CO., LTD, Zhuhai (CN)

( * ) Notice: Subject to any disclaimer, the term of this patent is extended or adjusted under 35 U.S.C. 154(b) by 0 days.

(21) Appl. No.: 14/258,093
(22) Filed: Apr. 22, 2014
(65) Prior Publication Data
   US 2014/0311554 A1  Oct. 23, 2014

(30) Foreign Application Priority Data
   Apr. 22, 2013 (CN) .......................... 2013 1 0139091

(51) Int. Cl.
   *H01L 31/048* (2014.01)
   *H01L 31/049* (2014.01)
   (Continued)

(52) U.S. Cl.
   CPC ............ *H01L 31/048* (2013.01); *H01L 31/049* (2014.12); *H01L 31/0481* (2013.01);
   (Continued)

(58) Field of Classification Search
   CPC . H01L 31/048; H01L 31/0481; H01L 31/049; H01L 31/058; H01L 31/18; H01L 31/1892; H02S 40/44; Y02E 10/60; Y02B 10/20
   USPC ............... 136/251; 438/55, 64, 106, 126, 127
   See application file for complete search history.

(56) References Cited

U.S. PATENT DOCUMENTS 5,707,459 A * 1/1998 Itoyama et al. ................ 136/251
5,728,230 A * 3/1998 Komori et al. ................ 136/251

(Continued)

FOREIGN PATENT DOCUMENTS

CN         1937263      *  3/2007
CN       101740650      *  6/2010

(Continued)

OTHER PUBLICATIONS

English translation for CN203026519.*

*Primary Examiner* — James Lin
*Assistant Examiner* — Liesl C Baumann

(57) ABSTRACT

The present invention provides a high-performance insulating hybrid photovoltaic-thermal solar panel core. The high-performance insulating hybrid photovoltaic-thermal solar panel core allows the polymer aluminum-based integrated plate to have a better light transmission as made of transparent polyethylene terephthalate, and contains a high temperature resistant insulating tape that completely encloses the edge of the aluminum-based integrated plate thus to enhance the insulation of the assembly. The high-performance insulating hybrid photovoltaic-thermal solar panel core is widely applied to the field of renewable energy source application products, such as solar water pumps, hybrid photovoltaic-thermal solar building members, solar heating systems, etc., thereby improving the aesthetics and insulation of the products.

2 Claims, 1 Drawing Sheet

(51) Int. Cl.
*H01L 31/18* (2006.01)
*H02S 40/44* (2014.01)

(52) U.S. Cl.
CPC ............ *H01L31/18* (2013.01); *H01L 31/1892* (2013.01); *H02S 40/44* (2014.12); *Y02B 10/10* (2013.01); *Y02B 10/20* (2013.01); *Y02E 10/50* (2013.01); *Y02E 10/60* (2013.01)

(56) References Cited

U.S. PATENT DOCUMENTS

| | | | |
|---|---|---|---|
| 6,311,436 B1 * | 11/2001 | Mimura et al. | 52/173.3 |
| 6,331,673 B1 * | 12/2001 | Kataoya et al. | 136/259 |
| 2002/0020440 A1 * | 2/2002 | Yoshimine et al. | 136/251 |
| 2005/0199279 A1 * | 9/2005 | Yoshimine et al. | 136/251 |
| 2005/0224108 A1 * | 10/2005 | Cheung | 136/251 |
| 2010/0043871 A1 * | 2/2010 | Xia et al. | 136/251 |
| 2012/0090778 A1 * | 4/2012 | Cheng et al. | 156/279 |
| 2012/0103401 A1 * | 5/2012 | Kitamura et al. | 136/251 |
| 2013/0000694 A1 * | 1/2013 | Bunea et al. | 136/246 |
| 2013/0037103 A1 * | 2/2013 | Nakano et al. | 136/256 |
| 2013/0340813 A1 * | 12/2013 | Momozaki et al. | 136/251 |
| 2014/0345674 A1 * | 11/2014 | Yang et al. | 136/251 |

FOREIGN PATENT DOCUMENTS

| | | | |
|---|---|---|---|
| CN | 202307936 | * | 7/2012 |
| CN | 203026519 U | * | 6/2013 |

* cited by examiner

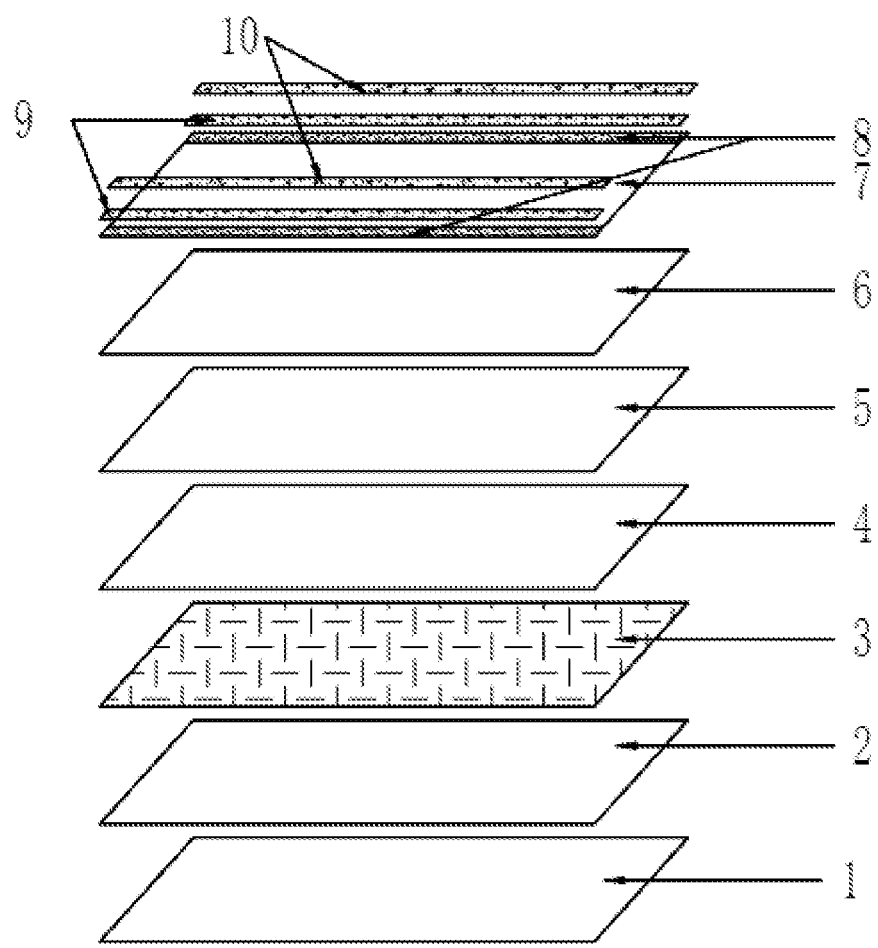

HIGH-PERFORMANCE INSULATING HYBRID PHOTOVOLTAIC-THERMAL SOLAR PANEL CORE AND MANUFACTURING METHOD THEREOF

CROSS REFERENCE TO RELATED APPLICATIONS

The present application claims the benefit of Chinese Patent Application No. 201310139091.2 filed on Apr. 22, 2013; the contents of which are hereby incorporated by reference.

TECHNICAL FIELD

The present invention belongs to the technical field of photovoltaic-thermal new energy sources, particularly to a high-performance insulating hybrid photovoltaic-thermal solar panel core and a manufacturing method thereof.

BACKGROUND OF THE PRESENT INVENTION

Despite the rapid development of the photovoltaic industry in China, the level of technology rises slowly and still has a large gap with the international advanced level. To realize the sustainable development of energy sources and environment, almost all the countries in the world focus on the solar photovoltaic generation as the development of new energy sources and renewable energy sources. At present, the photovoltaic cells in an existing hybrid photovoltaic-thermal assembly are laminated with an absorber, and a fluid channel is provided on the back of each of the photovoltaic cells. The combination of photovoltaic power generation and heat collection by fluid realizes both energy and land saving at the national level, and greatly enhances the substitution of renewable energy sources in the energy constitution. However, the hybrid photovoltaic-thermal assembly has disadvantages of poor insulation, poor appearance and difficult wire leading. During the manufacturing, it is required to solve problems on leakage and wire leading.

SUMMARY OF THE PRESENT INVENTION

In view of the above technical problems, the present invention improves the conventional photovoltaic assemblies and provides a high-performance insulating hybrid photovoltaic-thermal solar panel core and a manufacturing method thereof.

The present invention employs the following technical solutions.

A high-performance insulating hybrid photovoltaic-thermal solar panel core is provided, consisting of a first polyethylene terephthalate layer, a first ethylene-vinyl acetate copolymer layer, a photovoltaic cell string, a second ethylene-vinyl acetate copolymer layer, a second polyethylene terephthalate layer, a third ethylene-vinyl acetate copolymer layer, an aluminum-based integrated plate, a high temperature resistant insulating tape, a fourth ethylene-vinyl acetate copolymer layer and a third polyethylene terephthalate layer, which are cascaded from down to up in turn, laminated and then encapsulated, the aluminum-based integrated plate being an aluminum-based integrated plate with a polymer coating, the high temperature resistant insulating tape being a polyimide tape.

A method for manufacturing the high-performance insulating hybrid photovoltaic-thermal solar panel core is provided, including the following steps of: a: placing a piece of low-iron glass on a workbench at room temperature, keeping the glass clean and bright without any dusts, pollutants and other impurities on both the front and back, and laying a first polyethylene terephthalate layer and a first ethylene-vinyl acetate copolymer layer on the glass in turn; b: fixing the welded photovoltaic cell string onto the first ethylene-vinyl acetate copolymer layer of Step a; c: laying in turn a second ethylene-vinyl acetate copolymer layer, a second polyethylene terephthalate layer and a third ethylene-vinyl acetate copolymer layer onto the welded photovoltaic cell string of Step b; d: laying a layer of high temperature resistant insulating tape on the edge of the back of the aluminum-based integrated plate, where the high temperature resistant insulating tape should enclose the edge of the aluminum-based integrated plate completely; e: folding a lead-out wire of the welded photovoltaic cell string of Step b onto the high temperature resistant insulating tape of Step d, welding the lead-out wire properly, and then covering in turn with a fourth ethylene-vinyl acetate copolymer layer and a third polyethylene terephthalate layer of the same size as the high temperature resistant insulating tape of Step d; and f: placing the assembly obtained in Step e into a laminating machine for lamination, and taking the low-iron glass down from the surface after the assembly is taken out from the laminating machine to obtain a high-performance insulating hybrid photovoltaic-thermal solar panel core.

In view of the disadvantages of poor insulation, poor appearance and difficult wire leading of the hybrid photovoltaic-thermal assemblies, the present invention provides a high-performance insulating hybrid photovoltaic-thermal solar panel core and a manufacturing method thereof.

The high-performance insulating hybrid photovoltaic-thermal solar panel core allows the polymer aluminum-based integrated plate to have a better light transmission as made of transparent polyethylene terephthalate, and contains a high temperature resistant insulating tape that completely encloses the edge of the aluminum-based integrated plate thus to enhance the insulation of the assembly. Moreover, the incident light is not obstructed by the solar panel, and heat on solar cells can be taken away by a collector core effectively, so that the loss of power generation efficiency resulted from the temperature rising of the solar panel is reduced. Furthermore, with high thermal efficiency, the high-performance insulating hybrid photovoltaic-thermal solar panel core is applied to occasions having high demands of heat, and has uncomplicated process.

The high-performance insulating hybrid photovoltaic-thermal solar panel core is widely applied to the field of renewable energy source application products, such as solar water pumps, hybrid photovoltaic-thermal solar building members, solar heating systems, etc., thereby improving the aesthetics and insulation of the products.

BRIEF DESCRIPTION OF THE DRAWINGS

The present invention will be further described as below by embodiments with reference to FIG. 1.

FIG. 1 is an exploded structure diagram of a high-performance insulating hybrid photovoltaic-thermal solar panel core according to the present invention, in which:

1 First polyethylene terephthalate layer;
2 First ethylene-vinyl acetate copolymer layer;
3 Photovoltaic cell string;
4 Second ethylene-vinyl acetate copolymer layer;
5 Second polyethylene terephthalate layer;
6 Third ethylene-vinyl acetate copolymer layer;
7 Aluminum-based integrated plate;
8 High temperature resistant insulating tape;

9 Fourth ethylene-vinyl acetate copolymer layer; and
10 Third polyethylene terephthalate layer.

DETAILED DESCRIPTION OF THE PRESENT INVENTION

Referring to FIG. 1, a high-performance insulating hybrid photovoltaic-thermal solar panel core is provided, consisting of a first polyethylene terephthalate layer 1, a first ethylene-vinyl acetate copolymer layer 2, a photovoltaic cell string 3, a second ethylene-vinyl acetate copolymer layer 4, a second polyethylene terephthalate layer 5, a third ethylene-vinyl acetate copolymer layer 6, an aluminum-based integrated plate 7, a high temperature resistant insulating tape 8, a fourth ethylene-vinyl acetate copolymer layer 9 and a third polyethylene terephthalate layer 10, which are cascaded from down to up in turn, laminated and then encapsulated, the aluminum-based integrated plate 7 being an aluminum-based integrated plate with a polymer coating, the high temperature resistant insulating tape 8 being a polyimide tape.

A method for preparing the high-performance insulating hybrid photovoltaic-thermal solar panel core is provided, including the following steps of:

a: placing a piece of low-iron glass on a workbench at room temperature, keeping the glass clean and bright without any dusts, pollutants and other impurities on both the front and back, and laying a first polyethylene terephthalate layer 1 and a first ethylene-vinyl acetate copolymer layer 2 on the glass in turn;

b: fixing the welded photovoltaic cell string 3 onto the first ethylene-vinyl acetate copolymer layer 2 of Step a;

c: laying in turn a second ethylene-vinyl acetate copolymer layer 4, a second polyethylene terephthalate layer 5 and a third ethylene-vinyl acetate copolymer layer 6 onto the welded photovoltaic cell string 3 of Step b;

d: laying a layer of high temperature resistant insulating tape 8 on the edge of the back of the aluminum-based integrated plate 7, where the high temperature resistant insulating tape should enclose the edge of the aluminum-based integrated plate completely;

e: folding a lead-out wire of the welded photovoltaic cell string 3 of Step b onto the high temperature resistant insulating tape 8 of Step d, welding the lead-out wire properly, and then covering in turn with a fourth ethylene-vinyl acetate copolymer layer 9 and a third polyethylene terephthalate layer 10 of the same size as the high temperature resistant insulating tape 8 of Step d; and f: placing the assembly obtained in Step e into a laminating machine for lamination, and taking the low-iron glass down from the surface after the assembly is taken out from the laminating machine to obtain a high-performance insulating hybrid photovoltaic-thermal solar panel core.

What is claimed is:

1. A high-performance insulating hybrid photovoltaic-thermal solar panel core, consisting of a first polyethylene terephthalate layer (1), a first ethylene-vinyl acetate copolymer layer (2), a photovoltaic cell string (3), a second ethylene-vinyl acetate copolymer layer (4), a second polyethylene terephthalate layer (5), a third ethylene-vinyl acetate copolymer layer (6), an aluminum-based integrated plate (7) with a polymer coating, a polyimide tape (8), a fourth ethylene-vinyl acetate copolymer layer (9) and a third polyethylene terephthalate layer (10), which are cascaded in turn from down to up.

2. A method for manufacturing the high-performance insulating hybrid photovoltaic-thermal solar panel core according to claim 1, consisting of the following steps:

a: placing a piece of low-iron glass on a workbench at room temperature, and laying the first polyethylene terephthalate layer (1) and the first ethylene-vinyl acetate copolymer layer (2) on the glass in turn;

b: fixing the photovoltaic cell string (3) onto the first ethylene-vinyl acetate copolymer layer (2) of Step a;

c: laying in turn the second ethylene-vinyl acetate copolymer layer (4), the second polyethylene terephthalate layer (5) and the third ethylene-vinyl acetate copolymer layer (6) onto the photovoltaic cell string (3) of Step b;

d: laying the polyimide tape (8) on the edge of the back of the aluminum-based integrated plate (7), where the polyimide tape should enclose the edge of the aluminum-based integrated plate completely;

e: folding a lead-out wire of the photovoltaic cell string (3) of Step b onto the polyimide tape (8) of Step d, welding the lead-out wire, and then covering in turn with the fourth ethylene-vinyl acetate copolymer layer (9) and the third polyethylene terephthalate layer (10) of the same size as the polyimide tape (8) of Step d to form an assembly; and f: placing the assembly obtained in Step e into a laminating machine for lamination, and taking the low-iron glass down from the surface after the assembly is taken out from the laminating machine to obtain the high-performance insulating hybrid photovoltaic-thermal solar panel core.

* * * * *